US007222287B2

(12) United States Patent
Kondou (10) Patent No.: US 7,222,287 B2
(45) Date of Patent: May 22, 2007

(54) DECODER, ERROR POSITION POLYNOMIAL CALCULATION METHOD, AND PROGRAM

(75) Inventor: Keitarou Kondou, Tokyo (JP)

(73) Assignee: Sony Corporation, Tokyo (JP)

( * ) Notice: Subject to any disclaimer, the term of this patent is extended or adjusted under 35 U.S.C. 154(b) by 483 days.

(21) Appl. No.: 10/787,710

(22) Filed: Feb. 26, 2004

(65) Prior Publication Data

US 2004/0255226 A1    Dec. 16, 2004

(30) Foreign Application Priority Data

Feb. 27, 2003    (JP)    ............................. 2003-050327

(51) Int. Cl.
   *H03M 13/15* (2006.01)
(52) U.S. Cl. ..................................... 714/784
(58) Field of Classification Search ................. 714/784
   See application file for complete search history.

(56) References Cited

U.S. PATENT DOCUMENTS

| 4,868,828 | A | * | 9/1989 | Shao et al. .................. 714/704 |
| 5,541,937 | A | * | 7/1996 | Iwamura ..................... 714/785 |
| 5,566,190 | A | * | 10/1996 | Hattori ....................... 714/785 |
| 5,694,330 | A | * | 12/1997 | Iwamura et al. ............. 714/761 |
| 5,742,620 | A | * | 4/1998 | Iwamura ..................... 714/784 |
| 6,119,262 | A | * | 9/2000 | Chang et al. ............... 714/781 |
| 6,256,763 | B1 | * | 7/2001 | Oh et al. ..................... 714/784 |
| 6,304,994 | B1 | * | 10/2001 | Oh et al. ..................... 714/784 |
| 6,347,389 | B1 | * | 2/2002 | Boyer ......................... 714/784 |
| 6,378,103 | B1 | * | 4/2002 | Han ............................ 714/769 |
| 6,449,746 | B1 | * | 9/2002 | Truong et al. .............. 714/784 |
| 6,704,902 | B1 | * | 3/2004 | Shinbashi et al. .......... 714/785 |
| 7,047,481 | B2 | * | 5/2006 | Marconetti ................. 714/784 |
| 7,055,087 | B2 | * | 5/2006 | Kwon et al. ................ 714/784 |

OTHER PUBLICATIONS

Hsie-Chia Chang et al., "A (208, 192;8) Reed-Solomon Decoder for DVD Application", IDC '98 1998 IEEE International Conference on Communications, Conference Record, vol. 2, 1998, pp. 957-960.
Jyh-Horng Jeng et al., "On Decoding of Both Errors and Erasures of a Reed-Solomon Code Using an Inverse-Free Berlekamp-Massey Algorithm", IEEE Transactions on Communications, vol. 47, No. 10, Oct. 1999, pp. 1488-1494.

* cited by examiner

*Primary Examiner*—Stephen M. Baker
(74) *Attorney, Agent, or Firm*—Finnegan, Henderson, Farabow, Garrett & Dunner, L.L.P.

(57) ABSTRACT

The present invention realizes a decoder and an error position polynomial calculation method which realize erasure corrections by making less changes to a conventional Berlekamp algorithm calculation circuit. An error position polynomial $\sigma(x)$ is calculated on the basis of a syndrome $S_0$, $S_1, \ldots, S_{2t-1}$ and erasure position data $Er_0, Er_1, \ldots, Er_{2t-1}$ as Galois field expressions of erasure positions. In addition, switching of connection between buffers holding uncompleted operation results and an operator is controlled based on the number of erased received symbols and the number of processing steps, so that derivations of both the erasure position polynomial and the error position polynomial from erasure position data can be realized by the same circuit (an error position polynomial calculator).

4 Claims, 8 Drawing Sheets

C1 < Eras_num

| | INPUT 1 | INPUT 2 | OUTPUT |
|---|---|---|---|
| MULTIPLIER ML1 | 1 | σ | MUL1 |
| MULTIPLIER ML2 | Er$_{C1}$ | λ | MUL2 |
| MULTIPLIER ML3 | S | MUL1+MUL2 | MUL3 |

FIG.5B

C1 ≧ Eras_num

| | INPUT 1 | INPUT 2 | OUTPUT |
|---|---|---|---|
| MULTIPLIER ML1 | γ | σ | MUL1 |
| MULTIPLIER ML2 | δ | λ | MUL2 |
| MULTIPLIER ML3 | S | MUL1+MUL2 | MUL3 |

DECODER, ERROR POSITION POLYNOMIAL CALCULATION METHOD, AND PROGRAM

BACKGROUND OF THE INVENTION

1. Field of the Invention

The present invention relates to a decoder for Reed-Solomon codes, an error position polynomial calculation method, and a program for executing the error position polynomial calculation method.

This application claims the priority of the Japanese Patent Application No. 2003-050327 filed on Feb. 27, 2003, the entirety of which is incorporated by reference herein.

2. Description of the Related Art

Reference Cited (Non-Patent Publication) 1:

Communications, 1998. ICC 98. Conference Record. 1998 IEEE International Conference on, Volume: 2, 1998, A (208,192;8) "Reed-Solomon decoder for DVD application" by: Rsie-Chia Chang; Shung, C. B., Page(s): 957–960 vol. 2.

Reference Cited (Non-Patent Publication) 2:

Communications, IEEE Transactions on, Volume: 47 Issue: 10, Oct. 1999, "On decoding of both errors and erasures of a Reed-Solomon code using an inverse-free Berlekamp-Massey algorithm" by: Jyh-Horng Jeng; Trieu-Kien Truong, Page(s): 1488–1494.

There has been a coding method of decoding Reed-Solomon codes. In this method, if positions of those received words that have dropped from a transmission path are given, more errors can be corrected based on data concerning the positions than errors corrected in normal corrections.

This method uses an erasure position polynomial which takes an erasure position as a solution thereof, in addition to a group of numerical values which is called a syndrome and is calculated and obtained from received words during normal decoding. It is hence possible to compensate for drops of data up to a number equal to the parity number at the maximum. When this method is used in combination with a so-called interleave method, it is possible to cope with drops of large received data which may depend on a damage on a recording medium.

A description will now be made along a decoding method for Reed-Solomon codes.

When corrections are normally made in Reed-Solomon decoding, the relationship of $N-K=2t-1$ exists between the maximum number t of correctible errors t and code parameters (N, K).

At first, a syndrome $S_0, S_1, \ldots, S_{2t-1}$ is calculated from received data by a syndrome calculation circuit.

The syndrome polynomial is expressed by the following expression (1).

$$S(x) = \sum_{k=0}^{2t-1} S_k x^k \quad (1)$$

Also from the syndrome $S_0, S_1, \ldots, S_{2t-1}$, an error position polynomial is obtained by use of an error position polynomial calculation circuit. The error position polynomial is a polynomial expressed by the following expression (2) where positions of errors are $Z_0, Z_1, \ldots, Z_{2t-1}$.

$$\sigma(x) = \prod_{k=0}^{2t-1}(1 - Z_k x) = \sum_{i=0}^{2t-1} \sigma_i x^i \quad (2)$$

Further, an error value polynomial $\Omega(x)$ is obtained by the following expression (3) from the error position polynomial $\sigma(x)$ and the syndrome.

$$\Omega(x) = S(x)\sigma(x) \bmod x^{2t} \quad (3)$$

Hence, the position and numerical value of an actual error can be derived from these expressions.

To construct a circuit for decoding Reed-Solomon codes, the circuit which derives the error position polynomial $\sigma(x)$ makes the greatest influences on the circuit scale and the number of operation steps. The foregoing cited reference 1 introduces a circuit equipped with Berlekamp algorithms, as the circuit which calculates the error position polynomial $\sigma(x)$. This circuit is shown in FIG. 1.

Figure 1:
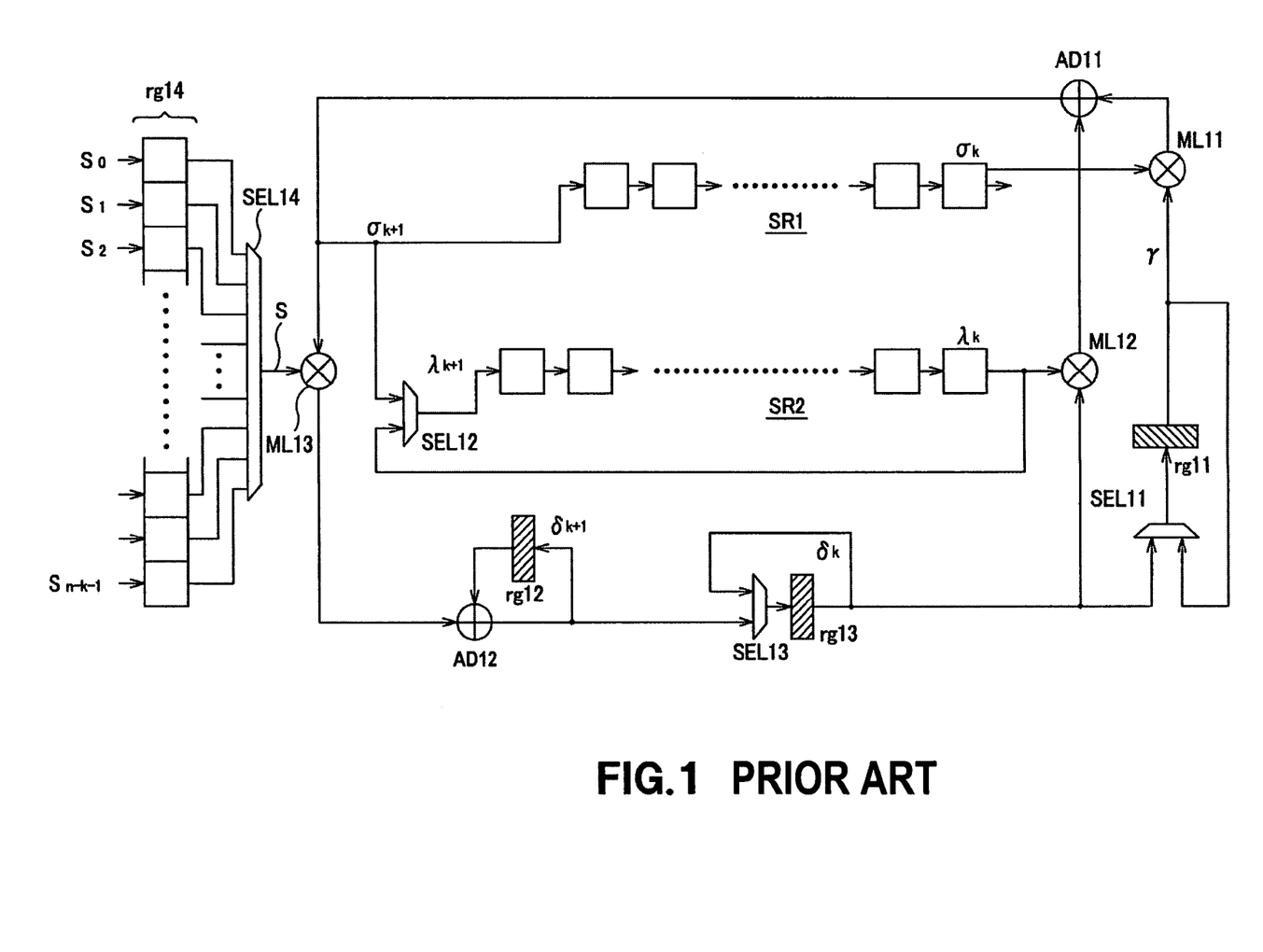
FIG. 1 is a circuit diagram of a circuit equipped with Berlekamp algorithms.

Provided in the circuit shown in FIG. 1 are input registers rg14 for the syndrome $S_0, S_1, \ldots S_{2t-1}$ and a selector SEL14 for making a selection from the input registers rg14. Also provided are a shift register SR1 for the series of variable $\sigma$ and a shift register SR2 for the series of valuable $\lambda$. There are further provided adders AD11 and AD12, multipliers ML11, ML12, and ML13, registers rg11, rg12, and rg13, and selectors SEL11 and SEL12.

In case of this circuit, a Galois field operation circuit having a large scale is constructed from only three circuits (multipliers ML11, ML12, and ML13), which is superior from the viewpoint of the circuit scale. This circuit, however, does not support erasure corrections.

When an erasure position expressed in form of a Galois field which indicates an error position of a symbol among code words is obtained in advance in correction processing for Reed-Solomon codes, the number of correctible errors can be raised up to N–K. This is called an erasure correction. The number of erasure position codes, Neras (the number of erasure errors), and Nerr (the number of errors) have the following relationship (4) between each other.

$$N-K=N_{eras}+2N_{err} \quad (4)$$

To make only erasure corrections, at first, the erasure position polynomial $\Lambda(x)$ expressed by the following expression (5) is calculated from a Galois field expressing an erasure position.

$$\Lambda(x) = \prod_{k \in \{erasure\_location\}}(1 - e^k \cdot x) = \prod_{i=0}^{2t-1} \Lambda_i x^i \quad (5)$$

To make only erasure corrections, the error value polynomial may be derived by substituting this expression for $\sigma(x)$ in the foregoing expression (2).

In case of performing simultaneously both the normal error corrections and the erasure corrections, the error position polynomial $\sigma$ is derived from the syndrome and the erasure position polynomial $\Lambda$.

The other foregoing cited reference 2 proposes modified Berlekamp algorithms which can perform erasure corrections with less changes to conventional algorithms.

Figure 2:
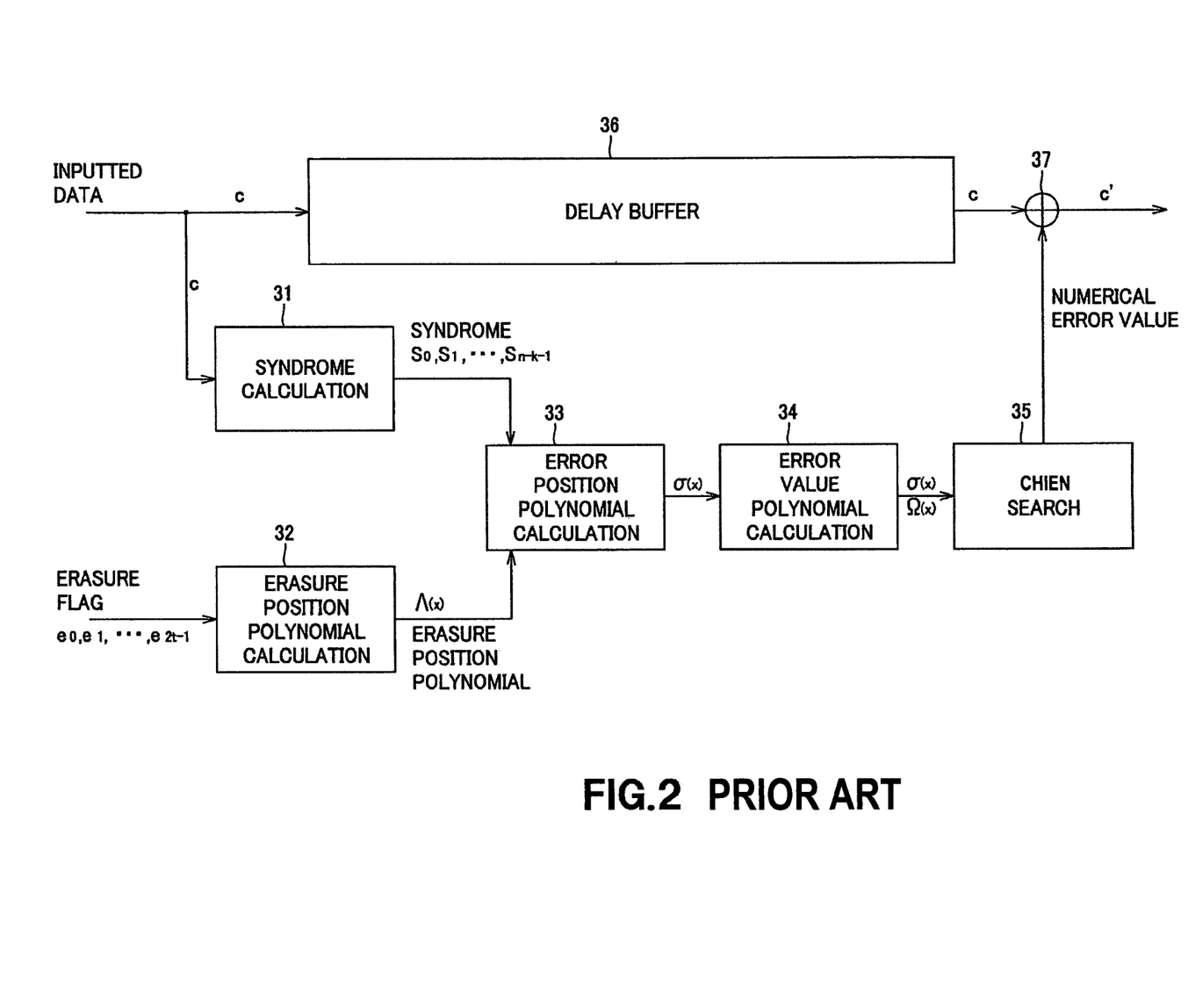
FIG. 2 is a block diagram of a decoder which supports erasure corrections.

FIG. 2 shows the entire configuration of a decoder proposed in the cited reference 2 in case of performing the normal error corrections and the erasure corrections simultaneously.

A syndrome calculator 31 calculates the syndrome $S_0$, $S_1, \ldots, S_{2t-1}$ from inputted data c.

An erasure position polynomial calculator 32 obtains the erasure position polynomial $\Lambda(x)$ from erasure flags $e_0$, $e_1, \ldots, e_{2t-1}$ by the foregoing expression (5).

An error position polynomial calculator 33 derives an error position polynomial $\sigma(x)$ from the syndrome $S_0$, $S_1, \ldots, S_{2t-1}$ and the erasure position polynomial $\Lambda(x)$.

A Chien searcher 35 obtains a numerical error value from the error position polynomial $\sigma$ and the error value polynomial 106 (x). Further, inputted data c is delayed by a delay buffer 36 to predetermined timing and inputted to an operator 37. In this operator 37, the inputted data c is subjected to an operation using the numerical error value from the Chien searcher 35, and is outputted as decoded data c'.

This configuration performs the normal error corrections and the erasure corrections simultaneously. It is however necessary for this configuration to derive the erasure position polynomial $\Lambda(x)$ from the erasure flags $e_0, e_1, \ldots, e_{2t-1}$ before deriving the error position polynomial $\sigma(x)$. In addition, the erasure position polynomial $\Lambda(x)$ must be processed after the syndrome calculation because the erasure position polynomial $\Lambda(x)$ cannot be calculated before all the erasure flags are inputted. Therefore, if the configuration shown in FIG. 2 is adopted, an operation step of calculating the erasure position polynomial is needed after completion of the syndrome calculation. A problem hence arises in that the number of necessary operation steps increases.

SUMMARY OF THE INVENTION

The present invention has been made in view of these problems, and has an object of realizing a decoder and an error position polynomial calculation method which can achieve erasure corrections by making less changes to a conventional calculation circuit based on Berlekamp-Massey algorithms.

Hence, a decoder according to the present invention comprises: a syndrome calculator which performs a syndrome calculation with respect to inputted data; an erasure position data calculator which calculates erasure position data from an inputted erasure flag; an error position polynomial calculator which calculates an error position polynomial on the basis of a syndrome obtained by the syndrome calculator and the erasure position data obtained by the erasure position data calculator; an error value polynomial calculator which calculates an error value polynomial from the error position polynomial; and a correction processor which calculates an error value from the error position polynomial and the error value polynomial, and performs a correction processing on the inputted data.

Further, the error position polynomial calculator includes a buffer having a selector to switch an input based on the number of processing steps from start of processing, and a selector which switches connection between the buffer and an operator, based on the number of processing steps and the number of pieces of erasure data, and wherein the error position polynomial calculator is constructed in a structure in which the error position polynomial which has the error position data as a solution, from a Galois field expression of an erasure position and the syndrome, is obtained.

In an error position polynomial calculation method according to the present invention, an error position polynomial is calculated by use of a syndrome calculated from inputted data and erasure position data calculated from an inputted erasure flag.

In particular, switching of connection between a buffer holding an uncompleted result of an operation and an operator is controlled on the basis of the number of erasure received words and the number of processing steps, to obtain the error position polynomial which has error position data as a solution, from a Galois field expression of an erasure position and a syndrome.

A program according to the present invention realizes this error position polynomial calculation method.

That is, conventionally, the error position polynomial $\sigma(x)$ is calculated on the basis of the syndrome $S_0, S_1, \ldots, S_{2t-1}$ and the erasure position polynomial $\Lambda(x)$ in case where erasure corrections are supported. In contrast, according to the present invention, the error position polynomial $\sigma(x)$ is calculated on the basis of the syndrome $S_0, S_1, \ldots, S_{2t-1}$ and the erasure position data $Er_0, Er_1, \ldots, Er_{2t-1}$. In addition, the erasure position data calculator obtains the erasure position data $Er_0, Er_1, \ldots, Er_{2t-1}$ from erasure flags $e_0, e_1, \ldots, e_{2t-1}$ through a simple calculation.

Moreover, switching of connection between buffers holding uncompleted results of operations, and the operator is controlled based on the number of erased received words and the number of processing steps, so that derivations of both the erasure position polynomial and the error position polynomial from erasure position data can be realized by one equal circuit (the error position polynomial calculator).

As a result, an advantage is obtained in that a decoder capable of erasure corrections can be constructed by making less changes to a conventional calculation circuit based on Berlekamp-Massey algorithms. This is also capable of reducing increase of the circuit scale to the minimum without involving increase in number of the Galois field multipliers.

Further, regardless of the number of erased received code words, processings can be achieved by a least necessary number of fixed steps, so that coding delays can be reduced to the minimum.

DETAILED DESCRIPTION OF THE PREFERRED EMBODIMENTS

Hereinafter, a decoder and an error position polynomial calculation method according to an embodiment of the present invention will be described with reference to FIGS. 3 to 8.

The decoder according to the present embodiment can support erasure position corrections while reducing the circuit scale and the number of operation steps.

Figure 3:
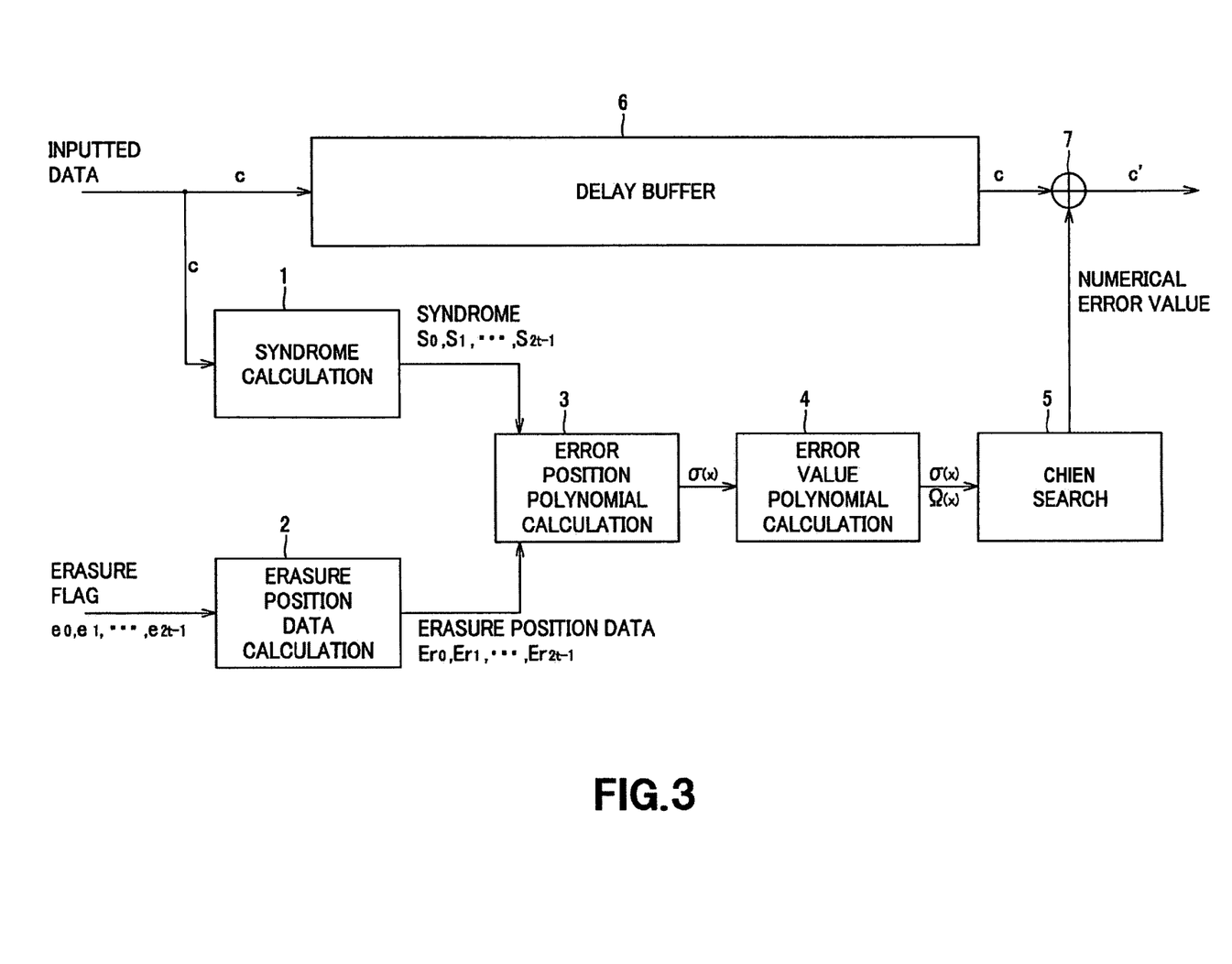
FIG. 3 is a block diagram of a decoder according to an embodiment of the present invention.

FIG. 3 shows the entire decoder for Reed-Solomon codes according to the present embodiment.

A syndrome calculator 1 calculates a syndrome $S_0$, $S_1, \ldots, S_{2t-1}$ from input data c.

An erasure position data calculator 2 calculates erasure position data $Er_0, Er_1, \ldots, Er_{2t-1}$ from inputted erasure flags $e_0, e_1, \ldots, e_{2t-1}$.

An error position polynomial calculator 3 derives an error position polynomial $\sigma(x)$ from the syndrome $S_0, S_1, \ldots, S_{2t-1}$ and the erasure position data $Er_0, Er_1, \ldots, Er_{2t-1}$.

An error value polynomial calculator 4 obtains an error value polynomial $\Omega(x)$ from the foregoing expression (3) by use of the error position polynomial $\sigma$.

A Chien searcher 5 obtains a numerical error value from the error position polynomial $\sigma$ and the error value polynomial $\Omega(x)$. Inputted data c is delayed by a delay buffer 6 to predetermined timing and inputted to an operator 7. The operator 7 operates the inputted data c by use of the numerical error value from the Chien searcher 5, and outputs decoded data c'.

This kind of decoder in the present embodiment differs from the foregoing decoder shown in FIG. 2 in the following two points (i) and (ii).

(i) In FIG. 2, the erasure position polynomial $\Lambda(x)$ is obtained by the erasure position polynomial calculator 32 in parallel with the calculation of the syndrome. In FIG. 3 according to the present embodiment, however, a module which converts the erasure flags $e_0, e_1, \ldots, e_{2t-1}$ into the erasure position data $Er_0, Er_1, \ldots, Er_{2t-1}$ expressing Galois fields is provided as the erasure position data calculator 2.

(ii) In FIG. 2, the error position polynomial calculator 33 derives the error position polynomial $\sigma(x)$ from the syndrome $S_0, S_1, \ldots, S_{2t-1}$ and the erasure position polynomial $\Lambda(x)$. In FIG. 3 according to the present embodiment, however, the error position polynomial calculator 3 derives the error position polynomial $\sigma(x)$ from the syndrome $S_0, S_1, \ldots, S_{2t-1}$ and the erasure position data $Er_0, Er_1, \ldots, Er_{2t-1}$.

At first, the erasure position data calculator 2 mentioned in (i) transmits Galois fields expressions of erasure positions ($Er_0, Er_1, \ldots, Er_{2t-1}$), which are obtained by the module, to the error position polynomial calculator 3 mentioned in (ii), i.e., a module which executes Berlekamp algorithms modified in this embodiment.

In place of calculating the erasure position polynomial, the erasure position data calculator 2 calculates the erasure position data $Er_0, Er_1, \ldots, Er_{2t-1}$ indicative of the erasure positions expressed by Galois fields, from the erasure flags (erasure positions) $e_0, e_1, \ldots, e_{2t-1}$, to obtain the following expression (6).

$$Er_i = \alpha^{e_i} \qquad (6)$$

In this expression, $\alpha$ is a primitive element of a Galois field. Although a lot of operation steps are needed to calculate the erasure position polynomial, the Galois field expression of each erasure position can be calculated through one operation step from one erasure position. Thus, the erasure position data calculator 2 is a simple circuit.

Figure 6:
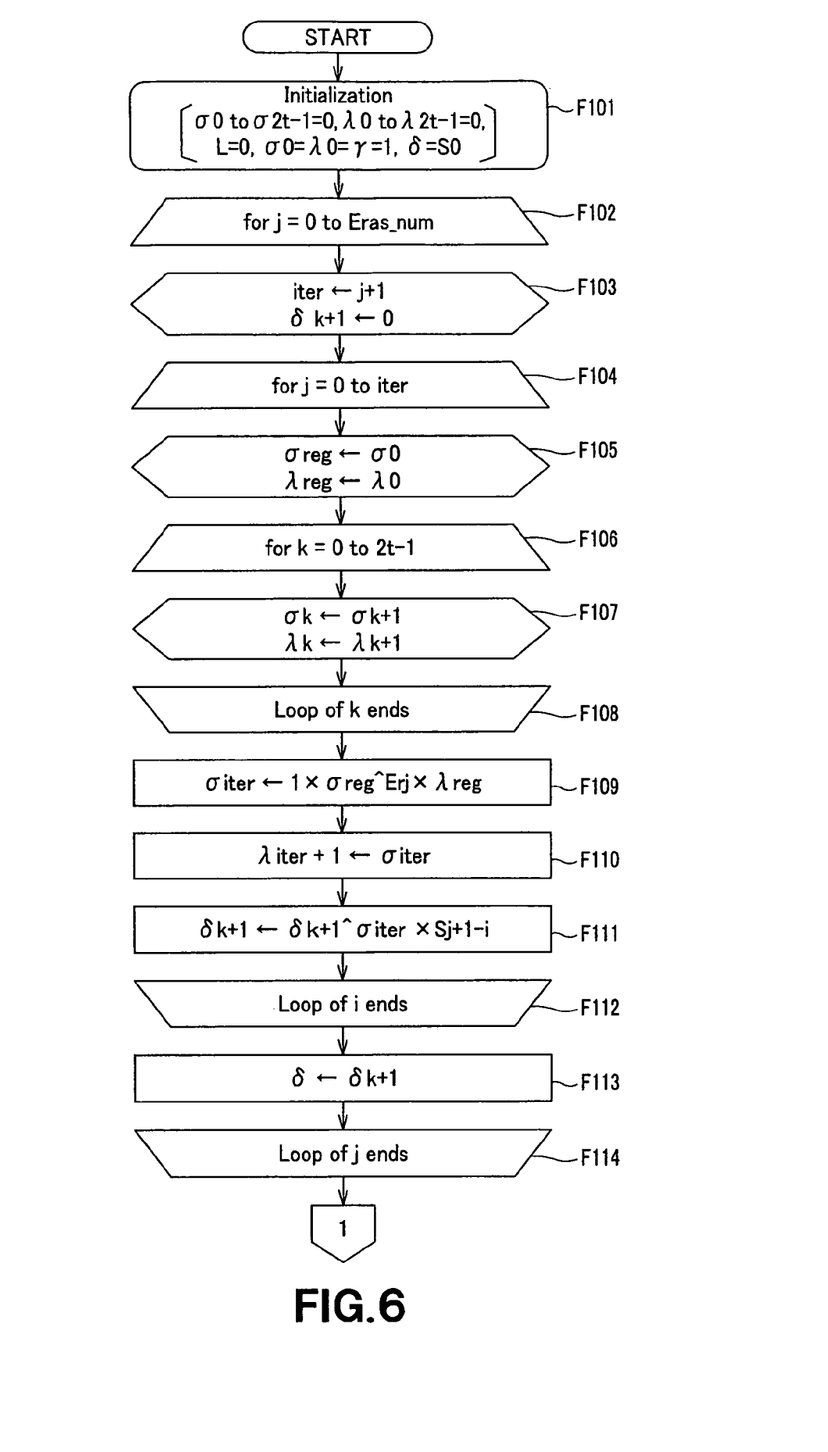
FIG. 6 is a flowchart of error position polynomial calculation processing in the embodiment.
Figure 7:
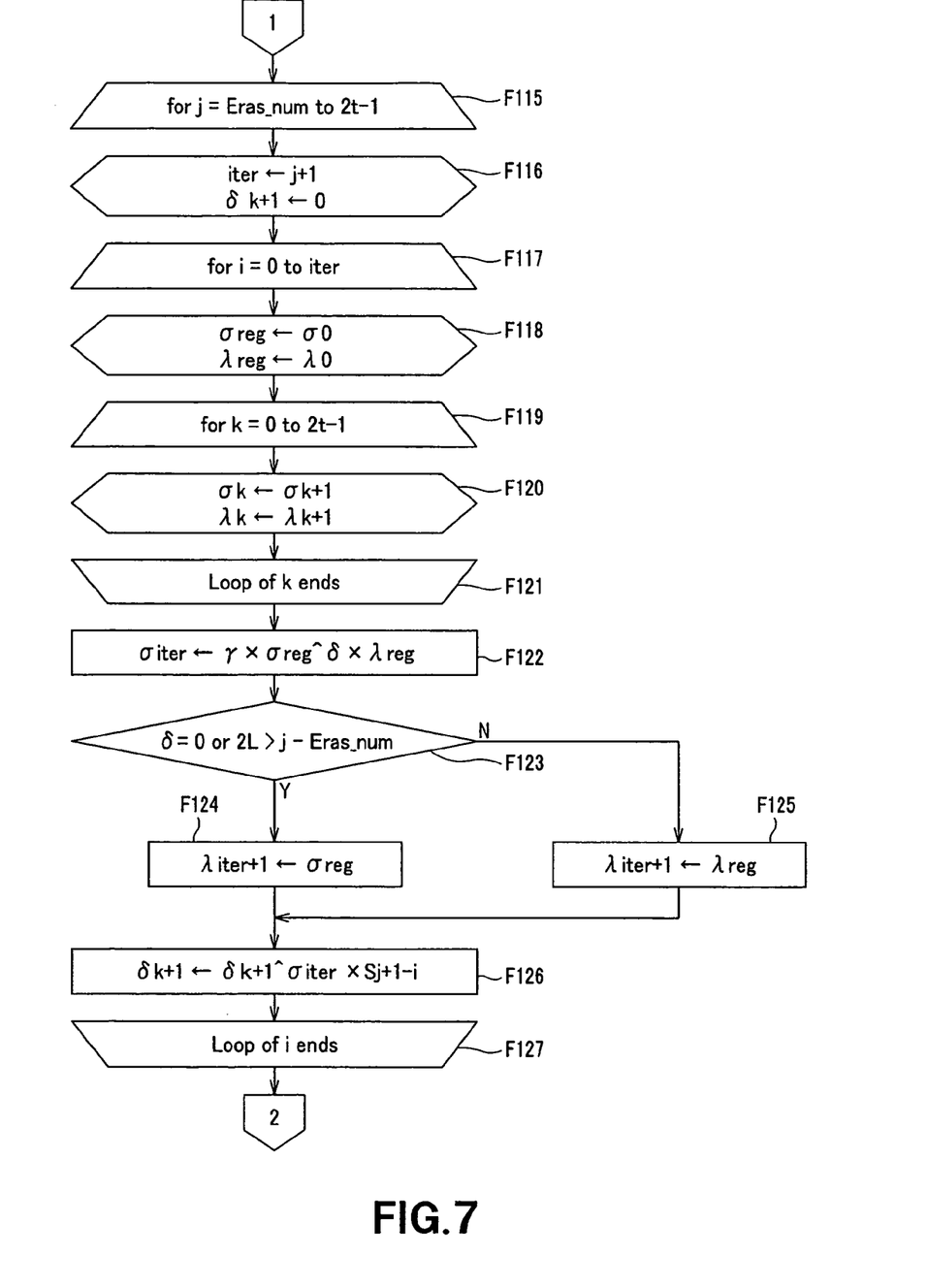
FIG. 7 is a flowchart of error position polynomial calculation processing in the embodiment.
Figure 8:
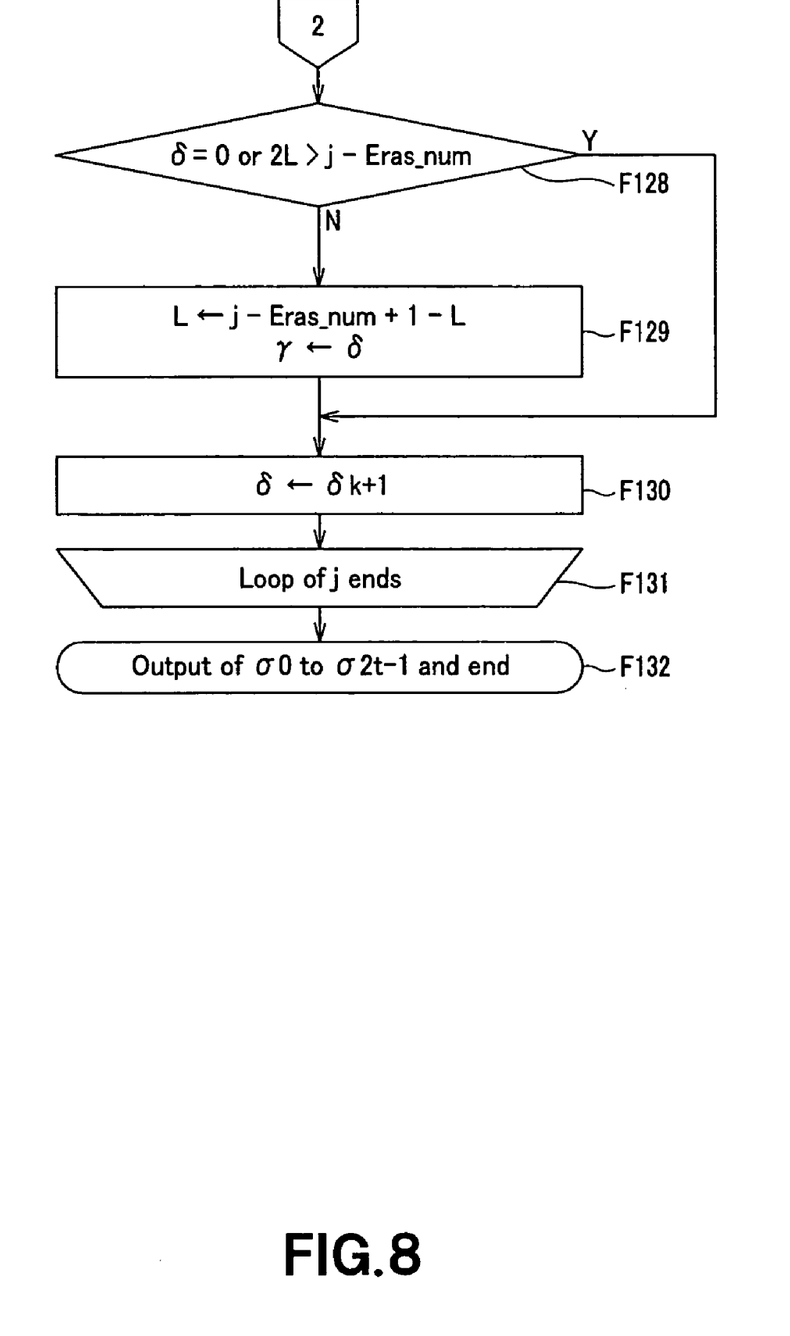
FIG. 8 is a flowchart of error position polynomial calculation processing in the embodiment.

The error position polynomial calculator 3 mentioned in foregoing (ii) derives the error position polynomial $\sigma(x)$ by use of the algorithms shown in FIGS. 6 to 8 which are modified on the basis of the Berlekamp algorithms, when a syndrome and erasure position data are given as inputs. A circuit configuration which realizes the algorithms is as shown in FIG. 4.

Figure 4:
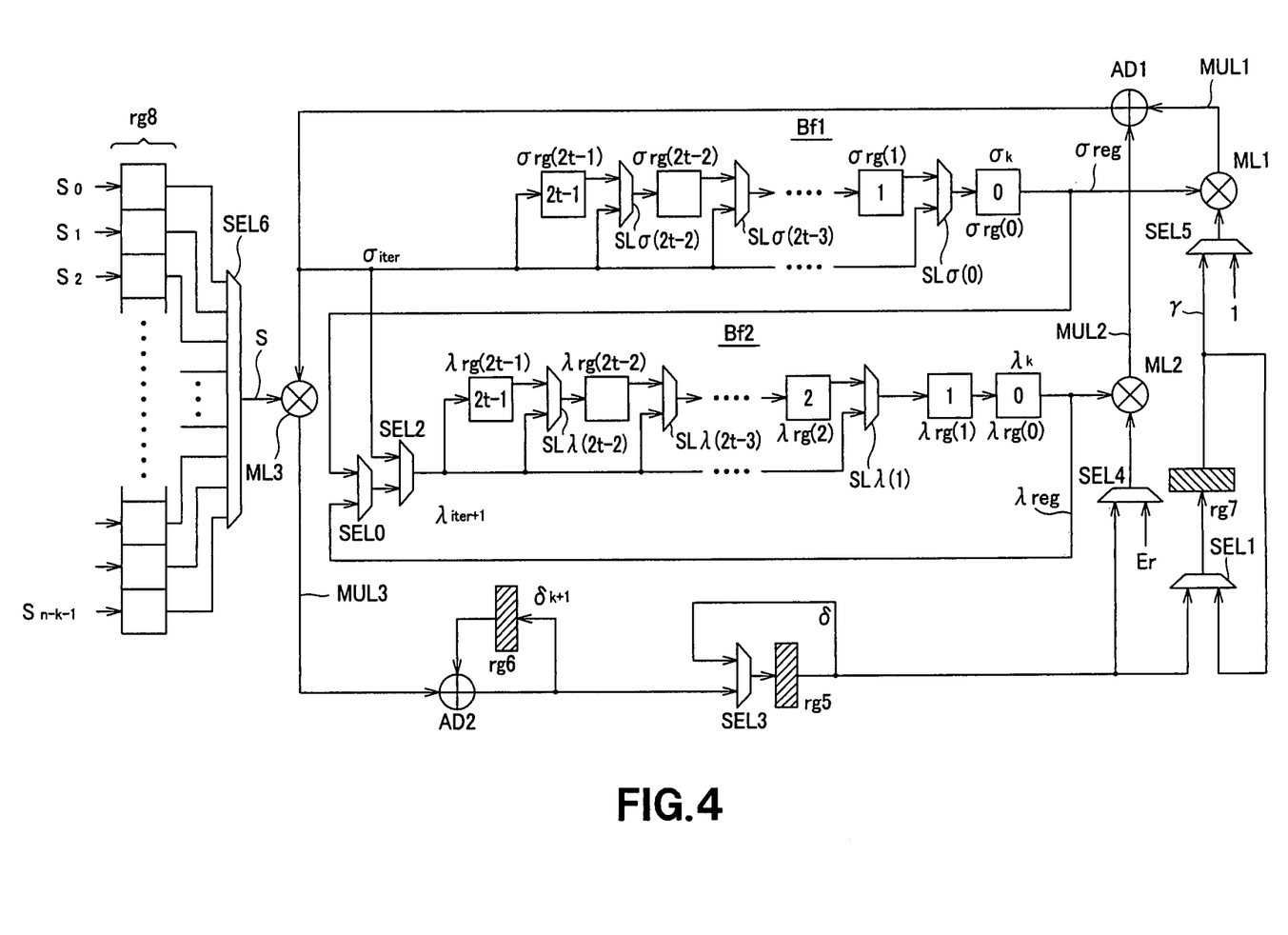
FIG. 4 is a circuit diagram of an error position polynomial calculator in the embodiment.

The configuration shown in FIG. 4 is described as follows:

Two counter values (C1, C2) updated by the number of processing steps
Buffers controlled by counter values
Galois field multiplier
Galois field multiplier switching circuit
Syndrome selection circuit These components will now be described.

<Two Counter Values Updated by the Number of Processing Steps (C1, C2)>

These two counter values C1 and C2 do not appear on the circuit shown in FIG. 4 but are values to control the operation of this circuit. In the algorithms in FIGS. 6 to 8 which will be described later, the counter values C1 and C2 are set as variables j and i. C1=j and C2=i are given.

The two counter values C1 and C2 are to perform processings I, II, III, and IV below. C1n and C2n are registers for holding the counter values.

I. C1n=0 and C2n=0
II. C1=C1n and C2=C2n
III. If C1=C2, C1n=C1+1 and C2n=0
   (If C1≠C2, C1n=C1 and C2n=C2+1)
IV. Return to II Of I to IV, I is executed when starting the processings, and the operations from II to IV are repeated for every processing step.

More specifically, the counter values "C1 and C2" thus shift to values as described below for every processing step.

"C1, C2"="0, 0"→"1, 0"→"1, 1"→"2, 0"→"2, 1"→"2, 2"→"3, 0"→...

It is to be noted that this is merely an example. Ranges of countable values as the variables j and i are set for the counter values C1 and C2 as will be described later with reference to FIGS. 6 to 8.

<Buffers Controlled by Counter Values>

The buffers controlled by counter values are buffers Bf1 and Bf2 shown in FIG. 4

The buffers Bf1 and Bf2 are each constructed as a shift register having selectors that switch inputs based on the number of processing steps from the start of processings.

That is, in the buffer Bf1, a shift register is constructed by registers $\sigma rg(0)$ to $\sigma rg(2t-1)$. The registers $\sigma rg(0)$ to $\sigma rg(2t-2)$ are respectively provided with selectors $SL\sigma(0)$ to $SL\sigma(2t-2)$ each of which selects and inputs the output of the register in an immediately preceding stage and the operation result inputted to the buffer Bf1.

Similarly in the buffer Bf2, a shift register is constructed by registers $\lambda rg(0)$ to $\lambda rg(2t-1)$. The registers $\lambda rg(1)$ to $\sigma rg(2t-2)$ are respectively provided with selectors $SL\lambda(1)$ to $SL\lambda(2t-2)$ each of which selects and inputs the output of the register in an immediately preceding stage and the operation result inputted to the buffer Bf2.

Also, the buffer Bf1 is inputted with an operation result $\sigma iter$ from an adder AD1.

Selectors SEL0 and SEL2 are provided in the input stage of the buffer Bf2. The selector SEL0 selects the value $\sigma reg$ from the register $\sigma rg(0)$ in the buffer Bf1 and the value $\lambda reg$ from the register $\lambda rg(0)$ in the buffer Bf2. The selector SEL2 selects the operation result $\sigma iter$ from the adder AD1 and the selected value from the selector SEL0, and inputs them to the buffer Bf2 as a value $\lambda iter+1$.

Each of the shift registers ($\sigma rg(0)$ to $\sigma rg(2t-1)$ and $\lambda rg(0)$ to $\lambda rg(2t-1)$) has to select an input to itself from the register in an immediately preceding stage and the operation results ($\sigma iter$ and $\lambda iter+1$) inputted to the buffers, according to the counter value C2. That is, selection states of the selectors SLσ(0) to SLσ(2t−2) and the selectors SLλ(1) to SLλ(2t−2) are controlled by the counter value C2.

This kind of configuration can suppress the number of necessary processing steps, compared with the circuit shown in FIG. 1.

<Galois Field Multiplier>

Galois field multipliers ML1, ML2, and ML3 are provided. These Galois field multipliers ML1, ML2, and ML3 multiply arbitrary two elements of Galois fields.

<Galois Field Multiplier Switching Circuit>

The circuit system including the Galois field multipliers ML1, ML2, and ML3 is constructed as follows.

The Galois field multiplier ML3 multiplies the syndrome S selected by the selector SEL6 by the operation result σiter of the adder AD1, and outputs a multiplication result MUL3. The output MUL3 of the Galois field multiplier ML3 is supplied to the adder AD2.

The adder AD2 adds up the outputs from register rg6 and the Galois field multiplier ML3, and outputs the addition result (δk+1). The output δk+1 from the adder AD2 is held by the register rg6. That is, the register rg6 then becomes a register which holds the value δk+1.

The output δk+1 from the adder AD2 is supplied to the selector SEL3. The selector SEL3 selects the output δk+1 and the value of the register rg5, and inputs them to the register rg5. This register rg5 then becomes a register which holds the value δ.

The value δ of the register rg5 is supplied to the selectors SEL1 and SEL4.

The selector SEL4 selects the value δ and the value Er of an erasure position and supplies them to the Galois field multiplier ML2. The Galois field multiplier ML2 multiplies the value from the selector SEL4 by the value λreg from the buffer Bf2, and supplies the multiplication result MUL2 to the adder AD1.

The selector SEL1 selects the value δ from the register rg5 and the value γ held by the register rg7, and inputs them to the register rg7. The register rg7 then becomes a register which holds the value γ.

The value γ of the register rg7 is supplied to the selector SEL5. The selector SEL5 selects the value γ and the value "1", and outputs them to the Galois field multiplier ML1.

The Galois field multiplier ML1 multiplies the value from the selector SEL5 by the value σreg from the buffer Bf1, and supplies the multiplication result MUL1 to the adder AD1.

In this circuit system, switching of inputs and outputs of the Galois field multipliers ML1, ML2, and ML3 are carried out by comparing the counter value C1 with the number Eras_num of data pieces marked with erasure flags.

Figure 5A:
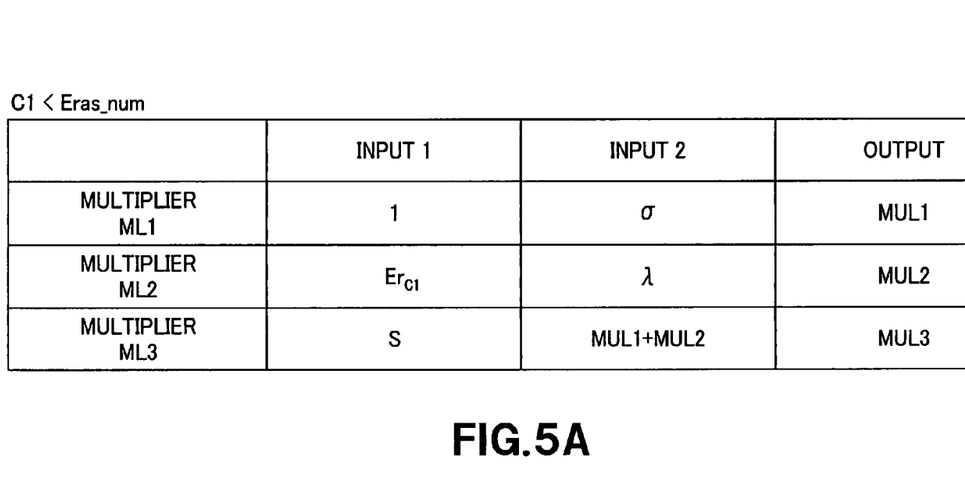
FIGS. 5A and 5B explain switching operations of Galois field multipliers in the embodiment.
Figure 5B:
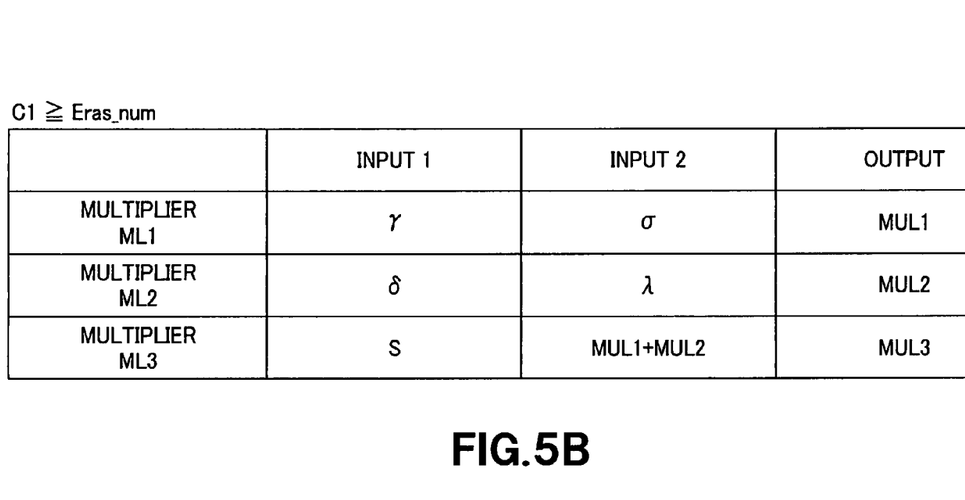

Connections of the three Galois field multipliers ML1, ML2, and ML3 are respectively switched as shown in FIGS. 5A and 5B by the selectors SEL5, SEL4, and SEL6.

FIG. 5A shows the case where C1<Eras_num is the result of comparing the counter value C1 with the number Eras_num of data pieces marked with erasure flags.

The Galois field multiplier ML1 is inputted with the value "1" and the value σ (σreg) from the buffer Bf1, and outputs the multiplication result MUL1.

The Galois field multiplier ML2 is inputted with the value $Er_{C1}$ of the erasure position data based on the counter value C1 and the λ(λreg) from the buffer Bf2, and outputs the multiplication result MUL2.

The Galois field multiplier ML3 is inputted with the syndrome S and the operation result (σiter=MUL1+MUL2) from the adder AD1, and outputs the multiplication result MUL3.

FIG. 5B shows the case where C1>Eras_num is the result of comparing the counter value C1 with the number Eras_num of data pieces marked with erasure flags.

The Galois field multiplier ML1 is inputted with the value γ and the value σ(σreg) from the buffer Bf1, and outputs the multiplication result MUL1.

The Galois field multiplier ML2 is inputted with the value δ and the value λ(λreg) from the buffer Bf2, and outputs the multiplication result MUL2.

The Galois field multiplier ML3 is inputted with the syndrome S and the operation result (σiter=MUL1+MUL2) from the adder AD1, and outputs the multiplication result MUL3.

The Galois field multiplier switching circuit is thus constructed.

<Syndrome Selection Circuit>

The syndrome selection circuit is constructed by a register rg8 which holds the inputted syndrome $S_0, S_1, \ldots, S_{2t-1}$, and a selector SEL6 which supplies the Galois field multiplier ML3 with the syndrome S which has selected the value $(S_0, S_1, \ldots, S_{2t-1})$ of the register rg8.

The selector SEL6 takes as an index a value calculated from the counter values C2 and C1, and outputs any of the syndrome S corresponding to the index. That is, in case where i is given as the index, this selector is a circuit which outputs Si from the syndrome $S_0, S_1, \ldots, S_{2t-1}$.

Hereinafter, the algorithms according to the present embodiment which can be realized by the circuit shown in FIG. 4 will be described with reference to FIGS. 6 to 8.

As described with reference to FIG. 3, the error position polynomial calculator 3 as the circuit shown in FIG. 4 is supplied with, as inputs thereto, the syndrome $S_0, S_1, \ldots, S_{2t-1}$ and the erasure position data $Er_0, Er_1, \ldots, Er_{2t-1}$.

In this case, the algorithms for deriving the error position polynomial σ(x) are as shown in FIGS. 6 to 8.

As has been described above, Eras_num is given by the erasure position calculation block in a preceding stage and is the number of positions where erasures have occurred.

As explained in the foregoing description, t is given by N−K=2t−1 where the code length is N and the transmission data word length is K.

σreg is a parameter to store σ, and λreg is a parameter to store λ. σiter and λiter are selected respectively from σ0 to σ2t−1 and from λ0 to λ2t−1, in correspondance with the value of the variable iter indicative of the number of repetitions.

In the step F101 in FIG. 6, initialization is carried out. That is, σ0 to σ2t−1 and λ0 to λ2t−1 are all set to "0". Also it is set that the internal variable L=0 used for processings. Further, σ0=λ0=γ=1 and δ=$S_0$ are set. More specifically, initialization is thus performed on the registers of the buffers Bf1 and Bf2 in FIG. 4, and the register rg5 which holds the value δ, and the register rg7 which holds the value γ.

In the step F102, 0 to the number Eras_num of erasure positions are set as the variable j corresponding to the count value C1, to define the number of loops of the variable j, i.e., the countable range of the count value C1.

In the step F103, the value of j+1 is set as the variable iter of the number of repetitions, and the value δk+1 in the register rg6 is set to "0".

In the step F104, 0 to the value iter are set as the variable i corresponding to the count value C2, to define the number of loops of the variable i, i.e., the countable range of the count value C2.

In the step F105, the value σ0 is set as the value σreg. In addition, the value λ0 is set as the value λreg.

Further in the step F106, 0 to 2t−1 are set as the variable k, to define the number of loops of the variable k.

In the step F107, the value λk is changed to the value σk+1, and the value λk is changed to the value λk+1. This is executed until the loop of k ends in the step F108.

That is, the values of the shift registers in the buffers Bf1 and Bf2 are shifted by the number of loops of the value k.

In the step F109, multiplications are performed by the Galois field multipliers ML1 and ML2, and an addition of the multiplication results MUL1 and MUL2 is performed by the adder AD1, to obtain the operation result Titer.

At this time, C1<Eras_num, i.e., the switched state shown in FIG. 5A is given because the count value C1 (=the value of j) has been set by the step F102. Therefore, the Galois field multiplier ML1 performs the multiplication of MUL1=1×σreg, and the Galois field multiplier ML2 the multiplication of MUL2=$Er_j$×λreg. The operation result σiter of the adder AD1 is accordingly obtained to be σiter=1×σreg+$Er_j$×λreg.

In the step F110, the value λiter+1 is changed to the operation result σiter. That is, the value σiter is inputted to the buffer Bf1 and also inputted to the buffer Bf2 as the selector SEL2 selects the σiter.

In the step F111, a multiplication and an addition are performed respectively by the Galois field multiplier ML3 and the adder AD2, so that the value δk+1 of the register rg6 is updated.

That is, the Galois field multiplier ML3 multiplies the operation result σiter and the syndrome Sj+1−i selected by the selector SEL6, and outputs the multiplication result MUL3 (=σiter×Sj+1−i). The adder AD2 adds up the multiplication result MUL3 and the value δk+1 of the register rg6. Further, the addition result (δk+1+σiter×Sj+1−i) is set as the value δk+1 of the register rg6.

The above processings are executed repeatedly until the loop of the variable i ends. After the end of the loop, the procedure goes from the step F112 to F113, and the value δ is updated to the value δk+1. That is, the selector SEL3 selects the value δk+1 and updates the value δ of the register rg5.

After the loop of the variable j ends, the procedure goes from the step F114 to the step F115 in FIG. 7.

In the step F115, the number Eras_num of the erasure positions to 2t−1 are set as the variable j corresponding to the count value C1, to define the loop processing of the variable j.

In the step F116, the value of j+1 is set as the variable iter of the number of repetitions, and the value δk+1 of the register rg6 is set to "0".

In the step F117, 0 to the value iter are set as the variable i corresponding to the count value C2, to define the loop processing of the variable i.

In the step F118, the value σ0 is set as the value σreg. In addition, the value λ0 is set as the value λreg.

In the step F119, 0 to 2t−1 are set as the variable k, to define the loop processing of the variable k.

Further in the step F120, the value σk is changed to the value σk+1, and the value λk is changed to the value λk+1. This is executed repeatedly until the loop of k ends in the step F121.

That is, the values of the shift registers in the buffers Bf1 and Bf2 are each shifted by the number of loops of the value k.

In the step F122, multiplications are performed by the Galois field multipliers ML1 and ML2, and an addition of the multiplication results MUL1 and MUL2 is performed by the adder AD1, to obtain the operation result σiter.

At this time, C1≧Eras_num, i.e., the switched state shown in FIG. 5B is given because of the count value C1 (=the value of j) has been set by the step F115. Therefore, the Galois field multiplier ML1 performs the multiplication of MUL1=γ×σreg, and the Galois field multiplier ML2 performs the multiplication of MUL2=δ×λreg. The operation result σiter of the adder AD1 is accordingly obtained to be σiter=γ×σreg+δ×λreg.

In the step F123, whether δ=0 is satisfied or the control variable L satisfies 2L>j−Eras_num is determined.

If any of these conditions is satisfied, the value λiter+1 is changed to the σreg in the step F124.

In this case, the operation result σiter is inputted to the buffer Bf1. In addition, the selectors SEL0 and SEL2 select the value σreg of the buffer Bf1, so the value σreg is inputted to the buffer Bf2.

Alternatively, if none of the conditions in the step F123 is satisfied, the value λiter+1 is set as the value λreg.

In this case, the operation result σiter is inputted to the buffer Bf1. In addition, the selectors SEL0 and SEL2 select the value λreg of the buffer Bf2, so that the value λreg is inputted to the buffer Bf2.

In the step F126, a multiplication and an addition are performed respectively by the Galois field multiplier ML3 and the adder AD2, so the value δk+1 of the register rg6 is updated.

That is, the Galois field multiplier ML3 multiplies the operation result σiter and the syndrome Sj+1−i selected by the selector SEL6, and outputs the multiplication result MUL3 (=σiter×Sj+1−i). The adder AD2 adds up the multiplication result MUL3 and the value δk+1 of the register rg6. Further, the addition result (δk+1+σiter×Sj+1−i) is set as the value δk+1 of the register rg6.

The above processings are executed repeatedly until the loop of the variable i ends. After the end of the loop, the procedure goes from the step F127 to F128 in FIG. 8. Further, whether δ=0 is satisfied or L satisfies 2L>j−Eras_num is determined.

If any of these conditions is satisfied, the procedure goes to the step F130.

If none of the conditions is satisfied, the variable L is set to j−Eras_num+1−L in the step F129, and the value γ is updated to the value δ. With respect to the value γ, the selector SEL1 selects the value δ of the register rg5, and updates the register rg7.

In the step F130, the value δ is updated to the value δk+1. That is, the selector SEL3 selects the value δk+1, and updates the value δ of the register rg5.

The processings from the step F116 to step F131 are executed repeatedly until the loop of the variable j ends. After the end of the loop, the procedure goes to the step F132. At this time point, σ0 to σ2t−1 are outputted as the values held by the shift registers σrg(0) to σrg(2t−1), as the buffer Bf1, and then the processing flow is terminated.

Through the processings described above, the error position polynomial σ(x) is outputted from the error position polynomial calculator 3.

That is, according to the present embodiment, the error position polynomial σ(x) is calculated on the basis of the syndrome $S_0, S_1, \ldots, S_{2t-1}$ and the erasure position data $Er_0$, $Er_1, \ldots, Er_{2t-1}$ in case where erasure corrections are supported. In contrast, conventionally, the error position polynomial σ(x) is calculated on the basis of the syndrome $S_0, S_1, \ldots, S_{2t-1}$ and the erasure position polynomial Λ(x) in the same case.

In addition, switching of the connection between the buffers Bf1 and Bf2 holding uncompleted results of operations, and the operator (Galois field multipliers ML1, ML2, and ML3) is controlled based on the number (Eras_num) of erased received words and the number (the count value C1) of processing steps, so that derivations of both the erasure position polynomial and the error position polynomial from the erasure position data can be realized by only the circuit shown in FIG. 4.

According to this method, it is possible to construct a decoder capable of erasure corrections by making less changes to the calculation circuits based on the Berlekamp-Massey algorithms.

Expansion of the circuit scale can be reduced to the minimum without involving increase in number of Galois field multipliers.

In addition, the processings can be realized by a least necessary number of fixed steps regardless of the number of erased words among received code words, so that decoding delays can be reduced to the minimum.

The decoder according to the present invention has the configuration shown in FIG. 3 and using the error position polynomial calculator 3 which obtains the error position polynomial σ(x) by the algorithms shown in FIGS. 6 to 8 in the circuit configuration shown in FIG. 4.

An error position polynomial calculation method or program according to the present invention is, for example, a calculation method using the algorithms shown in FIGS. 6 to 8 or a program to execute the calculation method.

That is, the embodiment described above corresponds to the decoder, error position polynomial calculation method, and program according to the present invention. The present invention, however, is not limited to this embodiment but various modifications can be considered within the scope of the subject matter of the invention.

The program according to the present invention may be temporarily or permanently stored (recorded) in a ROM, non-volatile memory, or RAM in an electronic device (e.g., a disc drive device, tape recording/reproducing device, communication device, or the like) including a decoder. Alternatively, the program may be temporarily or permanently stored (recorded) in a removable recording medium such as a flexible disc, CD-ROM (Compact Disc Read Only Memory), MO (Magnet Optical) disc, DVD (Digital Versatile Disc), magnetic disc, semiconductor memory, or the like. This kind of removable recording medium can be supplied in form of a so-called software package, and can be used for designing/manufacturing electronic devices such as a disc drive device mentioned above.

Note that the program can be not only installed from a removable recording medium as described above but also downloaded from a server or the like which stores the program by a network such as the Internet via a LAN (Local Area Network).

The invention claimed is:

1. A decoder comprising:
a syndrome calculator which performs a syndrome calculation with respect to inputted data;
an erasure position data calculator which calculates erasure position data from an inputted erasure flag;
an error position polynomial calculator which calculates an error position polynomial on the basis of a syndrome obtained by the syndrome calculator and the erasure position data obtained by the erasure position data calculator;
an error value polynomial calculator which calculates an error value polynomial from the error position polynomial; and
a correction processor which calculates an error value from the error position polynomial and the error value polynomial, and performs a correction processing on the inputted data.

2. The decoder according to claim 1, wherein the error position polynomial calculator includes
a buffer having a selector to switch an input based on the number of processing steps from start of processing, and
a selector which switches connection between the buffer and an operator, based on the number of processing steps and the number of pieces of erased data, and wherein
the error position polynomial calculator is constructed in a structure in which the error position polynomial which has the error position data as a solution, from a Galois field expression of an erasure position and the syndrome, is obtained.

3. An error position polynomial calculation method of calculating an error position polynomial by use of a syndrome calculated from inputted data and erasure position data calculated from an inputted erasure flap, wherein switching of connection between a buffer holding an uncompleted result of an operation and an operator is controlled on the basis of the number of erased received words and the number of processing steps, to obtain the error position polynomial which has error position data as a solution, from a Galois field expression of an erasure position and a syndrome.

4. A computer readable medium having a computer program for causing a computer to perform a method of calculating an error position polynomial by use of a syndrome calculated from inputted data and erasure position data calculated from an inputted erasure flag, wherein the computer executes processing in which switching of connection between a buffer holding an uncompleted result of an operation and an operator is controlled on the basis of the number of erased received words and the number of processing steps, to obtain the error position polynomial which has error position data as a solution, from a Galois field expression of an erasure position and a syndrome.

* * * * *